United States Patent
Sekigawa

(10) Patent No.: US 9,667,061 B2
(45) Date of Patent: May 30, 2017

(54) SEMICONDUCTOR ELEMENT DRIVE DEVICE

(71) Applicant: FUJI ELECTRIC CO., LTD., Kawasaki-shi (JP)

(72) Inventor: Kiyoshi Sekigawa, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 80 days.

(21) Appl. No.: 14/643,126

(22) Filed: Mar. 10, 2015

(65) Prior Publication Data

US 2015/0180227 A1 Jun. 25, 2015

Related U.S. Application Data

(63) Continuation of application No. PCT/JP2013/079645, filed on Oct. 31, 2013.

(30) Foreign Application Priority Data

Nov. 22, 2012 (JP) .................................. 2012-255949

(51) Int. Cl.
*H02H 9/02* (2006.01)
*H02M 1/08* (2006.01)
(Continued)

(52) U.S. Cl.
CPC ............. *H02H 9/02* (2013.01); *G08B 21/185* (2013.01); *H02H 9/04* (2013.01); *H02M 1/08* (2013.01);
(Continued)

(58) Field of Classification Search
CPC .. H02H 9/03; H02H 9/02; H02H 9/04; H02M 1/08; H02M 1/32; H02M 7/5387; G08B 21/185; H03K 17/0828; H03K 17/18
See application file for complete search history.

(56) References Cited

U.S. PATENT DOCUMENTS 4,959,561 A * 9/1990 McDermott ..... H03K 19/00361
326/15
2001/0019249 A1* 9/2001 Kato ................. H02M 7/53871
318/400.06
(Continued)

FOREIGN PATENT DOCUMENTS

JP 08070580 A 3/1996
JP 11017508 A 1/1999
(Continued)

OTHER PUBLICATIONS

International Search Report issued in PCT/JP2013/079645, dated Feb. 4, 2014.

*Primary Examiner* — Zeev V Kitov
(74) *Attorney, Agent, or Firm* — Rossi, Kimms & McDowell LLP

(57) ABSTRACT

A semiconductor element drive device includes a drive circuit which drives a semiconductor element configuring a power conversion device; an alarm generation circuit which generates alarm signals with pulse widths corresponding to protection factors in accordance with the outputs of detection circuits which detect information necessary for the operation of protecting the semiconductor element; an output circuit which externally outputs the alarm signals at a predetermined level; a protection cancellation circuit which generates a protection cancellation signal over a fixed period in accordance with the inverting output of a drive stop signal generation circuit, which stops the drive of the semiconductor element by the drive circuit in accordance with the outputs of the detection circuits, and with the output of the alarm generation circuit; and an output control circuit which changes the signal output level of the output circuit in accordance with the protection cancellation signal.

7 Claims, 5 Drawing Sheets

(51) Int. Cl.

| | | |
|---|---|---|
| *H02M 1/32* | (2007.01) | |
| *G08B 21/18* | (2006.01) | |
| *H02H 9/04* | (2006.01) | |
| *H03K 17/082* | (2006.01) | |
| *H03K 17/18* | (2006.01) | |
| *H02M 7/5387* | (2007.01) | |

(52) U.S. Cl.
CPC .......... *H02M 1/32* (2013.01); *H03K 17/0828* (2013.01); *H03K 17/18* (2013.01); *H02M 7/5387* (2013.01)

(56) References Cited

U.S. PATENT DOCUMENTS

2010/0202170 A1\* 8/2010 Kim .................. H02M 3/33507
                                                                                      363/74
2012/0146782 A1     6/2012 Komatsu et al.

FOREIGN PATENT DOCUMENTS

| JP | 2003088093 A | 3/2003 |
|---|---|---|
| JP | 2012143125 A | 7/2012 |

\* cited by examiner

SEMICONDUCTOR ELEMENT DRIVE DEVICE

CROSS-REFERENCE TO RELATED APPLICATIONS

This application is a continuation of International Application No. PCT/JP2013/079645, filed on Oct. 31, 2013, and is based on and claims priority to Japanese Patent Application No. JP 2012-255949, filed on Nov. 22, 2012. The disclosure of the Japanese priority application and the PCT application in their entirety, including the drawings, claims, and the specification thereof, are incorporated herein by reference.

BACKGROUND

Field

Embodiments of the present invention relate to a semiconductor element drive device which drives a plurality of semiconductor elements configuring a power conversion device and which includes the function of notifying information necessary for protecting the semiconductor elements.

Discussion of the Background

Recently, an intelligent power module (IPM) has attracted attention. The intelligent power module is such that protection circuits for protection against anomalies, such as an overcurrent of the semiconductor element, a drop in the voltage of control power, and overheating, together with a semiconductor element formed of a power transistor, such as an IGBT, and its drive circuit, are modularized into one electronic component. Also, it is proposed in, for example, Japanese Publication No. JP-A-8-70580 that in addition to the plurality of protection circuits which detect the heretofore described respective anomalies, a notification circuit (an output circuit) which externally outputs an alarm signal with a preset pulse width in accordance with the type of the anomaly detected by each protection circuit is mounted on the intelligent power module. By including this kind of alarm signal notification circuit, a controller side which controls the drive device, for example, an inverter controller, by detecting the pulse width of the alarm signal, can distinguish the type of an anomaly occurring in a semiconductor element.

However, when a plurality of alarm signals with different pulse widths are output from the notification circuit at the same time, there is included the problem of it being difficult to distinguish between the alarm signals. Therefore, a semiconductor element drive device which avoids the heretofore described problem is disclosed in Japanese Publication JP-A-2012-143125, which, in general, makes it easy to distinguish between the alarm signals output as pulse signal trains. The semiconductor element drive device outputs one pulse's worth of alarm signal with a pulse width preset for each anomaly type, or outputs one pulse's worth of alarm signal after every present time interval, in accordance with a protection signal output from a protection circuit which has first detected an anomaly.

According to the semiconductor element drive device proposed in Japanese Publication JP-A-2012-143125, it does not happen that a plurality of types of alarm signals with different pulse widths are output at the same time. Consequently, it is easy to detect the pulse width of a notified alarm signal, and it is possible to accurately distinguish the type of an anomaly based on the pulse width of the detected alarm signal. However, when an anomaly of a semiconductor element is detected, it is only that one pulse's worth of alarm signal with a pulse width corresponding to the type of the anomaly is output, or that one pulse's worth of alarm signal is output after every preset time interval, meaning that there is the problem that even when the anomaly of the semiconductor element is cancelled, it is not possible to detect the cancellation.

In order to solve this kind of problem, for example, it is also conceivable to output an anomaly cancellation signal with a pulse width differing from that of the alarm signal by utilizing the fact that the outputs of the protection signals from the plurality of protection circuits stop when the anomaly of the semiconductor element is cancelled. However, in order that it is possible to clearly distinguish the anomaly cancellation signal, for example, when the pulse width of the anomaly cancellation signal is increased compared with that of the alarm signal, there arises the new problem that it takes a long time until the anomaly cancellation is detected.

SUMMARY

Embodiments of the invention provide a semiconductor element drive device which includes the function of accurately notifying an alarm signal with a pulse width corresponding to an anomaly factor occurring in a semiconductor element, and which includes the function of swiftly notifying that the anomaly factor of the semiconductor element is cancelled.

A semiconductor element drive device according to an embodiment of the invention includes a drive circuit which drives a semiconductor element configuring a power conversion device; a plurality of protection circuits which detect information necessary for the operation of protecting the semiconductor element, generate protection signals, and stop the drive of the semiconductor element by the drive circuit in accordance with the protection signals; an alarm generation circuit which generates alarm signals with pulse widths corresponding to protection factors in accordance with the protection signals output from the protection circuits; and an output circuit which externally outputs the alarm signals at a predetermined level.

In particular, the semiconductor element drive device according to the invention is characterized by further including a protection cancellation circuit which generates a protection cancellation signal over a fixed period when the outputs of the protection signals from the plurality of protection circuits stop and the outputs of the alarm signals from the alarm generation circuit stop; and an output control circuit which changes the signal output level of the output circuit in accordance with the protection cancellation signal.

The plurality of protection circuits include a control voltage detection circuit which detects a control voltage applied to the drive device, a temperature detection circuit which detects the temperature of the semiconductor element, and a current detection circuit which detects a current flowing through the semiconductor element, and generate respective protection signals facilitating low voltage protection, overheat protection, and overcurrent protection. Further, the protection cancellation circuit is configured including a one-shot circuit which, when the outputs of the protection signals from the plurality of protection circuits stop and the outputs of the alarm signals stop, is biased to generate the protection cancellation signal over a fixed period.

Also, the output control circuit is realized as, for example, a voltage divider circuit, provided in parallel with an output transistor configuring the output circuit, which divides the output voltage of the output transistor upon receiving the protection cancellation signal.

The alarm generation circuit is configured so as to continuously generate an alarm signal with a pulse width preset for a protection circuit, of the plurality of protection circuits, which has first output a protection signal, over a period in which the output of the protection signal is continuing. Furthermore, the alarm generation circuit is configured, for example, so as to, when one of the plurality of protection circuits outputs a protection signal, start to generate the alarm signal, and when the output of the protection signal stops, stop the generation of the alarm signal at the point at which the output of one pulse's worth of pulse signal in a pulse signal train forming the alarm signal is completed.

According to the semiconductor element drive device of this kind of configuration, one pulse's worth of alarm signal with a pulse width corresponding to an anomaly factor occurring in a semiconductor element is output, or one pulse's worth of alarm signal is output after every preset time interval. Consequently, it is easy to detect the pulse width of an alarm signal notified from the drive device, and it is possible to accurately distinguish the type of an anomaly based on the pulse width of the detected alarm signal. Moreover, a protection cancellation signal of a level differing from that of the alarm signal is output when the anomaly factor of the semiconductor element is cancelled and the output of the alarm signal finishes. Consequently, even without detecting the pulse width of the protection cancellation signal, the protection cancellation signal can be detected from its signal output level while being clearly distinguished from the alarm signal. Therefore, it is possible to easily and swiftly detect the cancellation of the anomaly factor from the protection cancellation signal.

In other words, for example, on a control portion side which generates the operation signal which drives a semiconductor element configuring a power conversion device, it is possible to accurately grasp an anomaly factor of the semiconductor element and take appropriate protection measures. Further, there is produced the advantage that it is possible, when the anomaly factor of the semiconductor element is cancelled, to swiftly detect the anomaly cancellation from the protection cancellation signal and promptly return the controller to a normal condition.

DETAILED DESCRIPTION OF ILLUSTRATED EMBODIMENTS

Figure 1:
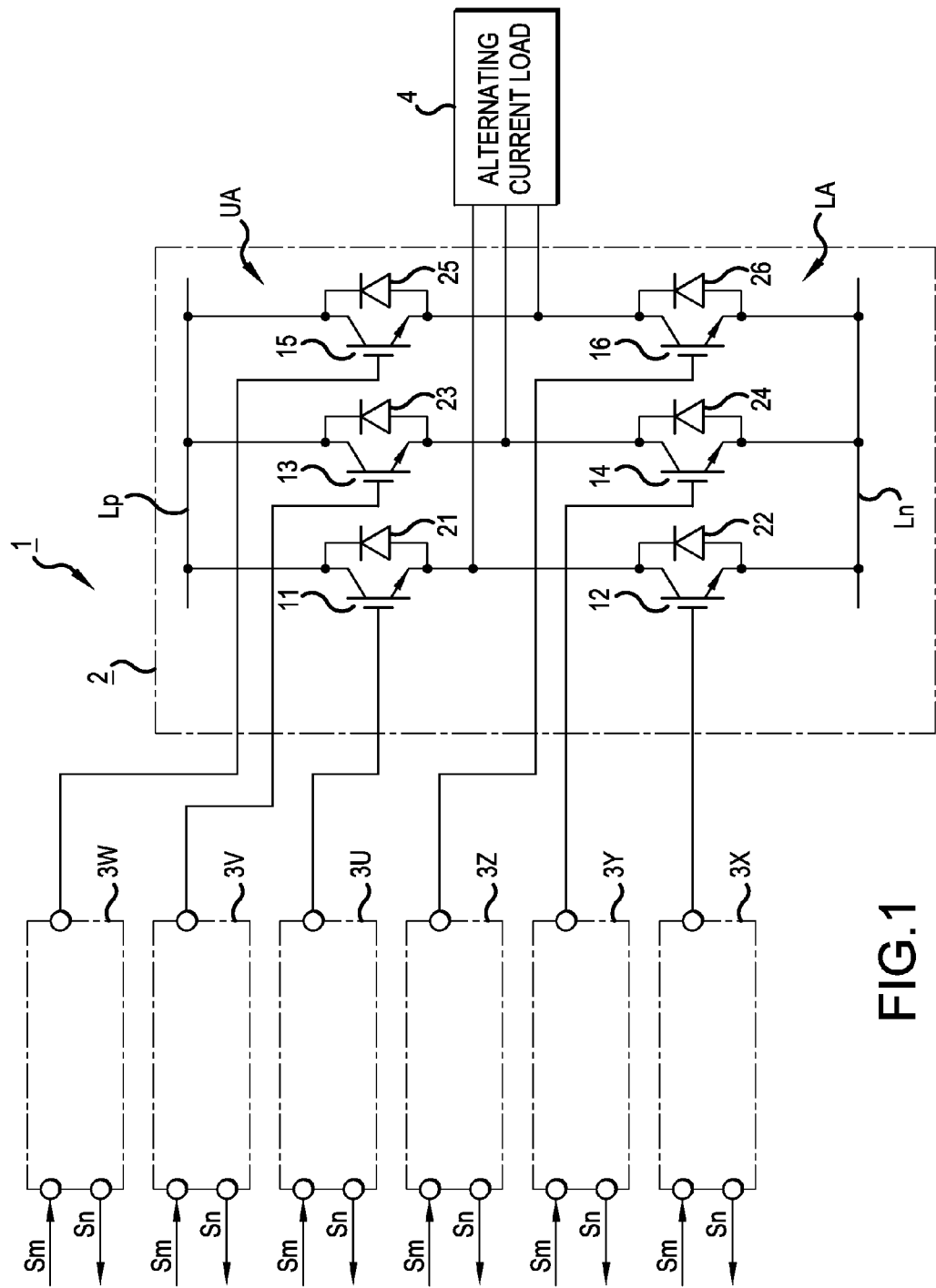
FIG. 1 is a diagram showing an overall outline configuration of a power conversion device to which embodiments of the invention may be applied.

Hereafter, a description will be given, referring to the drawings, of embodiments of the invention.

FIG. 1 is a block diagram showing an overall outline configuration of a power conversion device to which embodiments of the invention may be applied. The power conversion device 1, as well as including an inverter 2 which converts direct current power to alternating current power, includes six drive circuits 3U to 3Z which individually drive a plurality of semiconductor elements, for example, six IGBTs (Insulated Gate Bipolar Transistors) 11 to 16 configuring the inverter 2. Reference numerals 21 to 26 in FIG. 1 show free wheeling diodes respectively connected in reverse parallel between the emitter and collector of the IGBTs 11 to 16.

The six IGBTs 11 to 16 configuring the inverter 2, by being connected in series by twos, configure three sets of half bridge circuits. The half bridge circuits are interposed between a positive line Lp and negative line Ln of an unshown direct current power supply. The three sets of half bridge circuits provided in parallel configure a three-phase full bridge circuit which converts direct current power supplied between the positive line Lp and the negative line Ln to three-phase alternating current power. The three-phase alternating current power converted by the inverter 2 is supplied to an alternating current load 4 such as an electric motor.

More particularly, the IGBTs 11, 13, and 15, of the six IGBTs 11 to 16 configuring the inverter 2, which are connected to the positive line Lp configure upper arms UA which generate, one each, U-phase, V-phase, and W-phase positive powers of three-phase alternating current. Also, the IGBTs 12, 14, and 16 connected to the negative line Ln configure lower arms LA which generate, one each, X-phase, Y-phase, and Z-phase negative powers of three-phase alternating current. Further, the IGBTs 11 to 16, by being on/off driven in mutually different phases, switch the direct current power and output the three-phase alternating current powers from the series connection points of the IGBTs 11 to 16.

Figure 2:
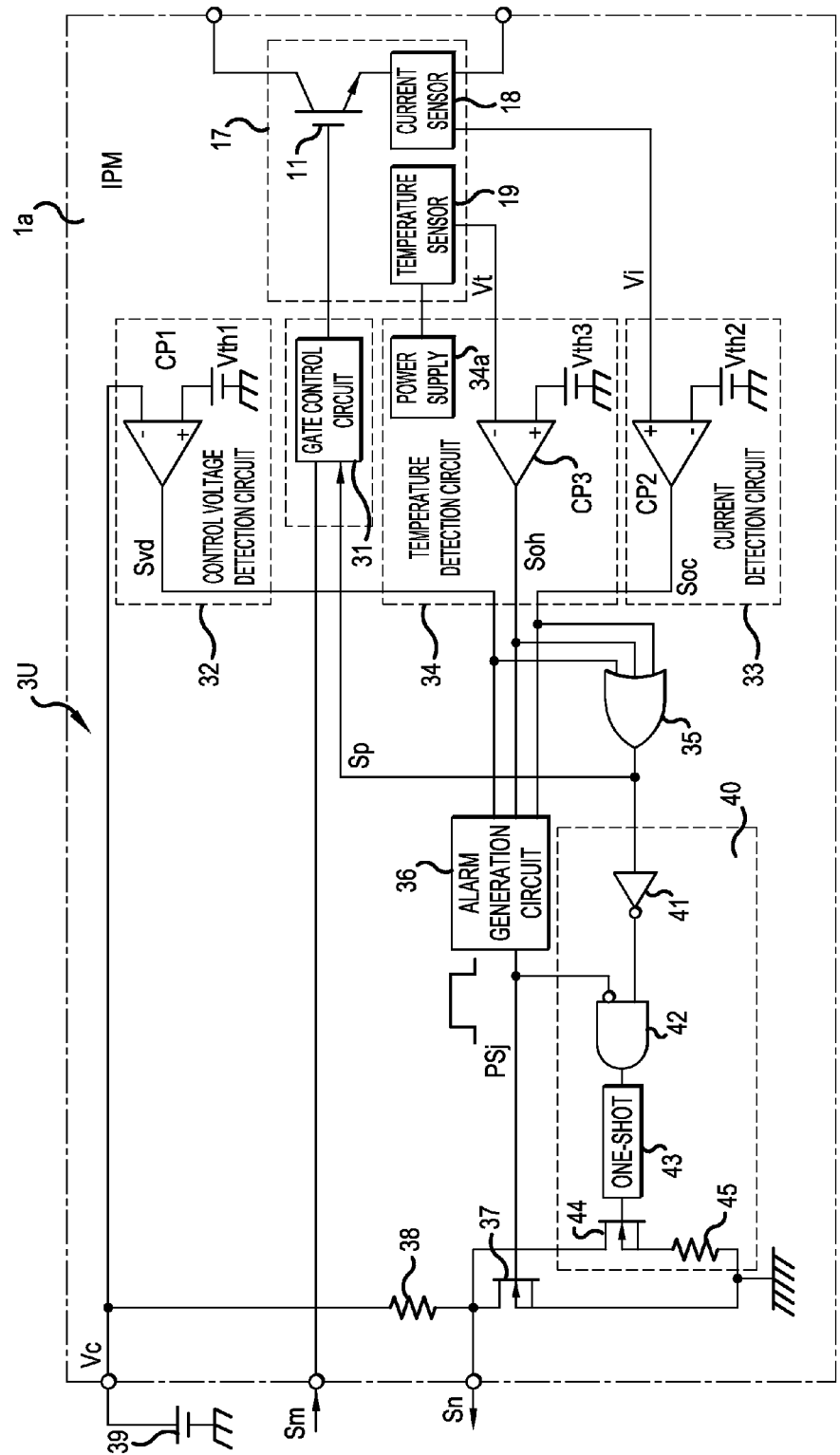
FIG. 2 is a main portion outline configuration diagram of a semiconductor element drive device according to an embodiment of the invention.

Each of the IGBTs 11 to 16 is mounted on one semiconductor chip 17 together with a current sensor 18 and a temperature sensor 19, as shown in, for example, FIG. 2, thus forming one chip. Although not particularly shown, the current sensor 18 has a current detection IGBT or current detection resistor which detects a current flowing between the collector and emitter of the IGBT 11. The current sensor 18 outputs a voltage Vi corresponding to the size of the current flowing between the collector and emitter of the IGBT 11. Also, the temperature sensor 19 includes a thermistor or a temperature detection diode. The temperature sensor 19 outputs a voltage Vt corresponding to a temperature T of the semiconductor chip 17. Also, each of the IGBTs 11 to 16, provided with the current sensor 18 and temperature sensor 19 to form one chip, is placed in one package together with each respective drive circuit 3U to 3Z to form an electronic component, and realized as the previously described intelligent power module (IPM) 1a.

FIG. 2 shows an outline configuration of a semiconductor element drive device, formed of the IGBT 11 and its drive circuit 3U, which is realized as the intelligent power module 1a. Herein, a description will be given, as a representative of the power conversion device 1, of an outline configuration of the drive device, formed of the U-phase IGBT 11 and its drive circuit 3U, which is realized as one electronic component (IPM 1a), but as the others of the remaining phases V to Z are also configured in the same way, a description thereof will be omitted.

The drive circuit 3U includes a gate control circuit 31 which inputs a control signal Sm given from an unshown inverter control portion for the semiconductor elements and on/off controls the gate of the IGBT 11. The control signal Sm is formed of a pulse signal pulse-width modulated (PWMed) in the inverter control portion under a phase control corresponding to each phase U-phase to Z-phase. Also, a protection signal Sp acting as a drive stop signal output from an OR circuit 35, to be described hereafter, is input into the gate control circuit 31.

When the protection signal Sp is turned off (at an L level), that is, when the protection signal Sp is not output, the gate control circuit 31 applies the control signal Sm to the gate of the IGBT 11 and on/off drives the IGBT 11. Also, when the protection signal Sp is turned on (at an H level), the gate control circuit 31, by preventing the control signal Sm from passing therethrough, stops the drive of the IGBT 11, thereby protecting the IGBT 11 against an anomaly.

Also, the drive circuit 3U includes a control voltage detection circuit 32, a current detection circuit 33, and a temperature detection circuit 34 as a plurality of protection circuits which realize the function of protecting the IGBT 11. The control voltage detection circuit 32 is configured mainly of a first comparator CP1 which compares a control voltage Vc of the drive circuit 3U supplied from an external power supply 39 and a preset first threshold voltage Vth1. When the control voltage Vc drops to equal to or less than the first threshold voltage Vth1, the control voltage detection circuit 32 configuring the first comparator CP1 detects the drop as an anomalous drop in the control voltage Vc and outputs an H-level voltage anomaly detection signal (protection signal) Svd.

Also, the current detection circuit 33 is configured mainly of a second comparator CP2 which compares a voltage Vi output from the current sensor 18 and a preset second threshold voltage Vth2. When the voltage Vi exceeds the second threshold voltage Vth2, the current detection circuit 33 configuring the second comparator CP2 detects the excess as an overcurrent and outputs an H-level overcurrent anomaly detection signal Soc as a protection signal.

Furthermore, the temperature detection circuit 34 is configured mainly of a third comparator CP3 which compares a voltage Vt, indicating the temperature T of the semiconductor chip 17, which is output from the temperature sensor 19 and a preset third threshold voltage Vth3. When the voltage Vt drops below the third threshold voltage Vth3, the temperature detection circuit 34 configuring the third comparator CP3 detects the drop as an overheat and outputs an H-level overheat anomaly detection signal Soh as a protection signal. A power supply 34a provided in the temperature detection circuit 34 assumes the role of supplying a constant current to a temperature detection diode used as the temperature sensor 19 and driving the temperature detection diode.

Further, when no anomaly factor is occurring in the IGBT 11, specifically, when there is no anomalous drop in the control voltage Vc, no overcurrent of the IGBT 11, or no overheat of the semiconductor chip 17 on which the IGBT 11 is formed, the respective outputs of the control voltage detection circuit 32, current detection circuit 33, and temperature detection circuit 34 are kept at the L level. Consequently, the anomaly detection signals Svd, Soc, and Soh are not output.

The OR circuit 35 inputs the anomaly detection signals Svd, Soc, and Soh output respectively from the control voltage detection circuit 32, current detection circuit 33, and temperature detection circuit 34, and generates the drive stop signal Sp for stopping the drive of the IGBT 11. The drive stop signal Sp is given to the gate control circuit 31, as previously described. Also, an alarm generation circuit 36, which inputs the anomaly detection signals Svd, Soc, and Soh, alternatively generates alarm signals PSvd, PSoc, and PSoh corresponding to the respective anomaly detection signals Svd, Soc, and Soh.

That is, the alarm generation circuit 36 includes an unshown pulse signal generator which generates at pulse intervals Ta one of pulse signals with mutually different pulse widths Tvd, Toc, and Toh preset correlated with the respective detection circuits 32, 33, and 34. The alarm generation circuit 36, when given the anomaly detection signal Svd, Soc, Soh from one of the detection circuits 32, 33, and 34, starts the pulse signal generator. Further, the alarm generation circuit 36 generates and outputs an alarm signal PSj (PSvd, PSoc, PSoh) formed of a pulse signal train with the pulse width Tvd, Toc, Toh correlated with the detection circuit 32, 33, 34 which has output the anomaly detection signal Svd, Soc, Soh.

The alarm generation circuit 36, when given the anomaly detection signals Svd, Soc, and Soh from the detection circuits 32, 33, and 34 at the same time, operates by taking in only the anomaly detection signal Svd (Soc, Soh) first given as the main factor of occurrence of a corresponding anomaly. Also, when the inputs of the anomaly detection signals Svd, Soc, and Soh from the detection circuits 32, 33, and 34 stop, the pulse signal generator stops the operation of generating the alarm signals PSj (PSvd, PSoc, and PSoh). That is, when the outputs of the anomaly detection signals Svd, Soc, and Soh stop, the pulse signal generator stops the operation of generating the alarm signals PSj (PSvd, PSoc, and PSoh) at the point at which one pulse's worth of output of each of the pulse signals with the respective pulse widths Tvd, Toc, and Toh is completed.

Incidentally, although not particularly shown, the pulse signal generator may be configured including, for example, an integrated circuit utilizing charging/discharging of a capacitor and a hysteresis comparator which controls the operation of the integrated circuit utilizing the charging/discharging of the capacitor. The hysteresis comparator compares first and second determination thresholds V1 and V2, which define respective upper limit voltage and lower limit voltage for charging and discharging the capacitor, and the output voltage of the integrated circuit, and controls the charging/discharging of the capacitor in accordance with results of the comparisons.

In particular, the pulse signal generator, by selectively setting a charging current of the capacitor in accordance with the anomaly detection signals Svd, Soc, and Soh, obtains from the hysteresis comparator an L-level output which defines the pulse widths Tvd, Toc, and Toh. Also, the pulse signal generator, by discharging electric charge accumulated in the capacitor with a constant current, obtains from the hysteresis comparator an H-level output which defines the pulse intervals Ta. The pulse signal generator generates the pulse signal trains using the outputs of the comparator.

Specifically, the pulse signal generator of the alarm generation circuit 36, when given, for example, the voltage anomaly detection signal Svd, repeats the operation of, after charging the capacitor with a reference current Ic, discharging the capacitor with a constant current Id, under the control of the hysteresis comparator. Then, as shown in (a) of FIG. 3, an L-level pulse signal with the pulse width Tvd is continuously generated at the pulse intervals Ta. Also, the pulse signal generator, when given the anomaly detection signal Soc indicating the overcurrent, repeats the operation of, after charging the capacitor with a current half the reference current Ic, discharging the capacitor with the constant current Id. Then, as shown in (b) of FIG. 3, an L-level pulse signal with the pulse width Toc (=2Tvd) twice as large as the pulse width Tvd is continuously generated at the pulse intervals Ta.

Furthermore, the pulse signal generator, when given the overheat anomaly detection signal Soh, repeats the operation of, after charging the capacitor with a current one-fourth the reference current Ic, discharging the capacitor with the constant current Id. Then, as shown in (c) of FIG. 3, an L-level pulse signal with the pulse width Toh (=4Tvd=2Toc) four times as large as the pulse width Tvd is continuously generated at the pulse intervals Ta. The pulse widths Tvd, Toc, and Toh, only having to have time differences which can be clearly distinguished from each other, can be optionally set.

Further, the alarm signals PSj (PSvd, PSoc, and PSoh) with the pulse widths corresponding to the anomaly types, which are generated by the alarm generation circuit 36, are applied to the gate of an output transistor 37 formed of a MOS-FET configuring an output circuit, thus on/off controlling the output transistor 37. As a result of this, the L-level pulse signals with the predetermined pulse widths with the control voltage Vc set to the H level are externally output via the output transistor 37 and an output terminal Sn. Reference numeral 38 in FIG. 2 is a load resistor interposed between the drain of the output transistor 37 formed of the MOS-FET and the power supply line of the control voltage Vc.

It is also naturally possible that the alarm generation circuit 36 is configured so as to output only one pulse of one of the pulse signals with the pulse widths Tvd, Toc, and Toh in accordance with the anomaly detection signal Svd, Soc, Soh. In this case, the pulse signal generator only has to be configured using, for example, one-shot circuits which generate, one each, the pulse signals with the pulse widths Tvd, Toc, and Toh.

Herein, the drive circuit 3U according to an embodiment of the invention is characterized in that, in addition to the heretofore described configuration, it further includes a protection cancellation circuit 40 which generates an anomaly cancellation signal over a fixed period in accordance with the output of the OR circuit 35 and the output of the alarm generation circuit 36. The protection cancellation circuit 40 includes an AND circuit 42 which, as well as inputting the output of the OR circuit 35 via an inverter circuit 41, inputs the output of the alarm generation circuit 36 into the negative logical terminal of the AND circuit 42.

When the output of the protection signal Sp is at the H level, or when the alarm signal PSj is output, the AND circuit 42 keeps the output at the L level. Further, when the output of the OR circuit 35 is at the L level, and the output of the alarm generation circuit 36 is at the L level, that is, when the output of the protection signal Sp stops, and the output of the alarm signal PSj stops, the output of the AND circuit 42 is inverted to the H level. Further, the AND circuit 42 assumes the role of, by inverting the output of the AND circuit 42 to the H level, biasing an one-shot circuit 43 and generating the protection cancellation signal over a fixed period as the output of the one-shot circuit 43.

The protection cancellation signal which is the output of the one-shot circuit 43 is applied to the gate of a transistor 44 formed of a MOS-FET provided in parallel with the output transistor 37, thus on-controlling the transistor 44. The transistor 44 assumes the role of, by on-operating, connecting a predetermined resistor 45 in parallel between the drain and source of the output transistor 37. Consequently, when the output transistor 37 off-operates as a result of the stop of the output of the alarm signal PSj, the transistor 44 on-operates upon receiving the output of the one-shot circuit 43. Then, the control voltage Vc is divided by the resistor 38 and resistor 45, thus causing the drain voltage of the output transistor 37 to drop. Because of this, the output signal level of the output terminal Sn changes. Therefore, the transistor 44 assumes the role of acting as an output control circuit which changes the output signal level (output voltage) of the output terminal Sn to a voltage level differing from when outputting the alarm signal PSj.

Figure 4:
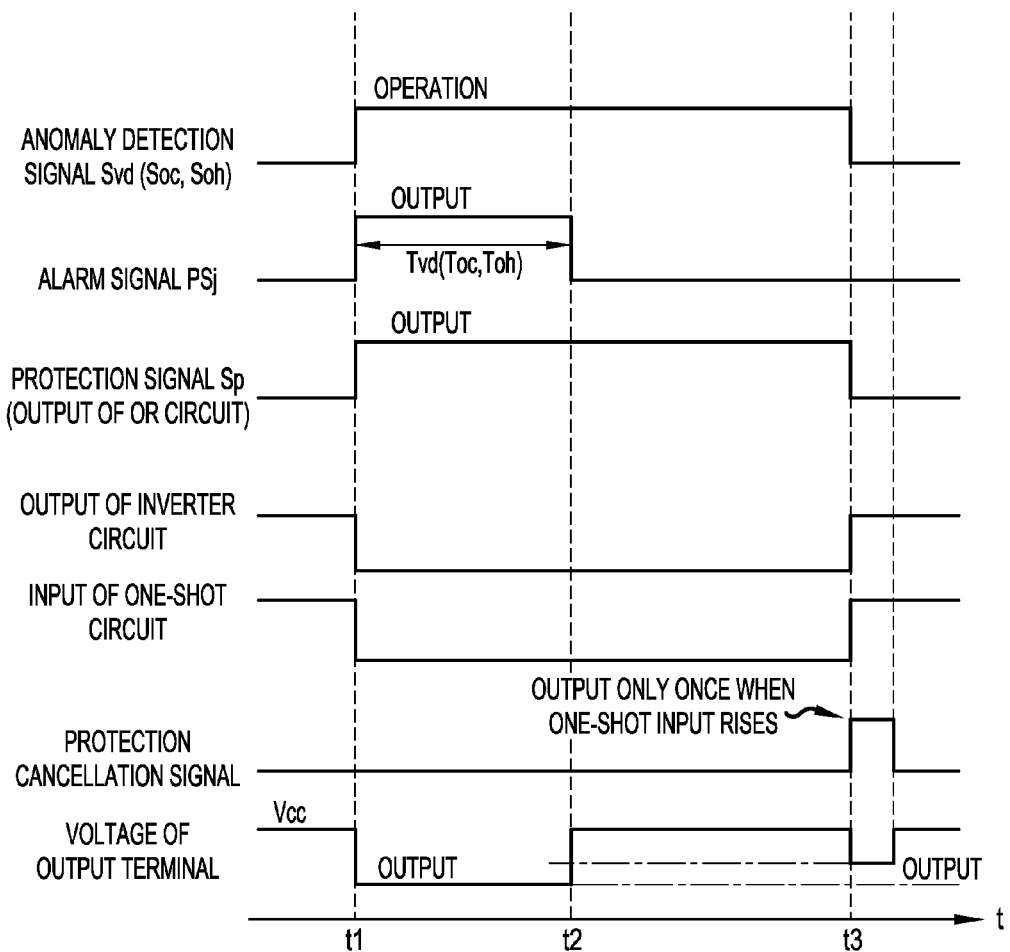
FIG. 4 is a signal waveform diagram for illustrating an operation of the drive device shown in FIG. 2.

Thus, according to the semiconductor element drive circuit 3U including the protection cancellation circuit 40 which functions in this way, when an anomaly is detected in one of the control voltage detection circuit 32, current detection circuit 33, or temperature detection circuit 34, the alarm signal PSj corresponding to the type of the anomaly is generated by and output from the alarm generation circuit 36, as the operational waveform diagram of the drive circuit 3U is shown in FIG. 4. At the same time, the drive stop signal Sp which stops the drive of the IGBT 11 is output from the OR circuit 35 <a timing t1>. At this time, even when one pulse's worth of output of the alarm signal PSj stops <a timing t2>, no protection cancellation signal is generated as long as the output of the drive stop signal Sp is continuing.

Thereafter, when the anomaly is cancelled, and the output of the anomaly detection signal from the detection circuit 32, 33, 34 stops <a timing t3>, the output of the drive stop signal Sp stops accordingly. Then, on condition that the output of the alarm signal PSj is stopped, the input of the one-shot circuit 43 is inverted to the H level, and the protection cancellation signal with the predetermined pulse width is generated and output. Further, the transistor 44 is on-driven by this protection cancellation signal, and the voltage of the output terminal Sn through which the alarm signal PSj has been externally output is shifted to a level differing from when outputting the alarm signal PSj.

Figure 3:
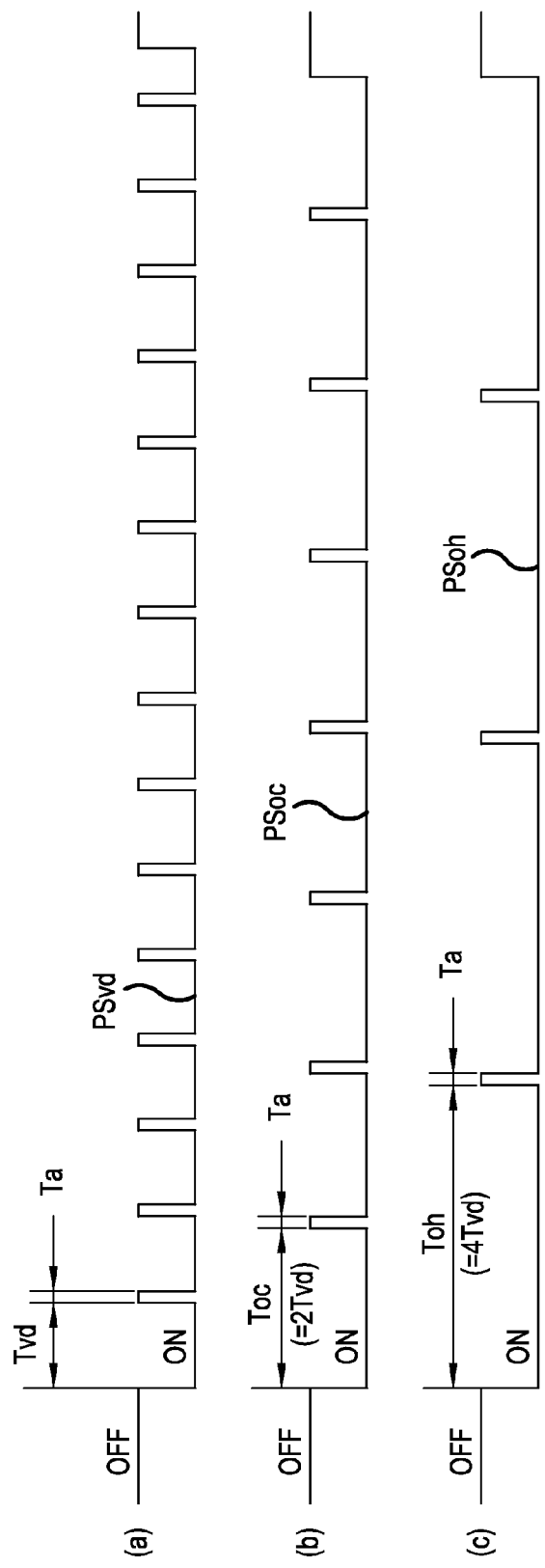
FIG. 3 is a diagram showing alarm signals generated by an alarm generation circuit shown in FIG. 2.

FIG. 4 illustrates the case of outputting one pulse's worth of alarm signal PSj with the predetermined pulse width, but the same also applies to the case of repeatedly outputting the alarm signal PSj with the predetermined pulse width at the regular pulse intervals Ta, as shown in FIG. 3. In this case, although not particularly shown, when the point at which the anomaly is cancelled is in the course of outputting the alarm signal PSj, the generation of the alarm signal PSj stops at the point at which one pulse's worth of output of the alarm signal PSj finishes. Therefore, the negative logical input of the AND circuit 42 is at the L level. Consequently, at the timing at which the one pulse's worth of output of the alarm signal PSj finishes, the one-shot circuit 43 is biased, and the protection cancellation signal with the predetermined pulse width is generated. Therefore, at the point at which the output of the alarm signal PSj finishes, a protection cancellation signal different in voltage level from the alarm signal PSj is swiftly output in place of the alarm signal PSj.

Consequently, on the control portion side which generates operation signals which drive the respective IGBTs 11 to 16, that is, on the inverter control portion side, it is possible to easily distinguish between the anomaly types indicated by the alarm signals PSj by monitoring the output voltage level of the output terminal Sn and measuring the output pulse width thereof. Furthermore, the anomaly cancellation signal can be reliably detected from a difference in the output voltage level of the output terminal Sn while being clearly distinguished from the alarm signals PSj. In particular, as the anomaly cancellation signal is detected from the difference in the output voltage level, it is not necessary to daringly measure the pulse width of the anomaly cancellation signal, and consequently, it is possible to swiftly detect the cancellation of the anomaly without a time delay.

Figure 5:
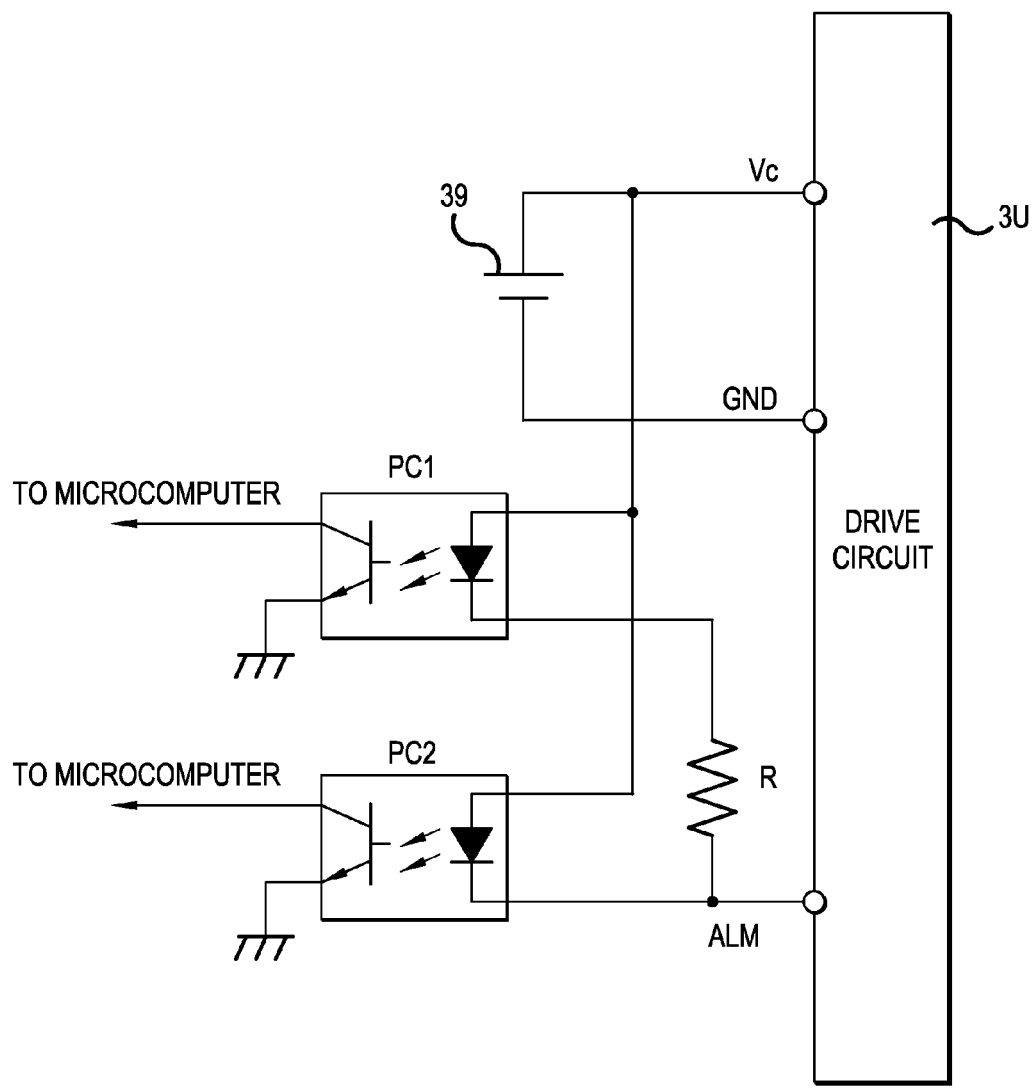
FIG. 5 is a diagram showing a configuration example of a detection circuit for detecting an output signal from the drive device.

When detecting the alarm signal PSj and anomaly cancellation signal on the control portion side, a configuration may include a first photocoupler PC1, which is current limited using a resistor R, and a second photocoupler PC2, which is not current limited, are interposed in parallel between the output terminal Sn and the external power supply 39, as shown in, for example, FIG. 5, thus detecting the outputs of the photocouplers PC1 and PC2.

According to the signal detection circuit configured in this way, as the first photocoupler PC1 is current limited by the resistor R, the first photocoupler PC1 is driven only when the alarm signal PSj having a high signal level is output. As opposed to this, as the second photocoupler PC2 is not current limited, the second photocoupler PC2 is driven when one of the alarm signal PSj or anomaly cancellation signal is output. In other words, the second photocoupler PC2 is driven not only when the alarm signal PSj is output, but also when the anomaly cancellation signal is output.

Consequently, when the output signal from the drive circuit 3U is detected in the first and second photocouplers PC1 and PC2 at the same time, this is determined to be the output of the alarm signal PSj. Further, by measuring the pulse width of the alarm signal PSj from, for example, the output of the detection by the first photocoupler PC1, it is possible to clearly distinguish the type of the alarm signal PSj, that is, the anomaly type. Also, when only the second photocoupler PC2 detects the output signal from the drive circuit 3U, the output signal can be detected as the output of the protection cancellation signal while being distinguished from the alarm signal PSj.

Thus, according to the semiconductor element drive device configured in the way heretofore described, for example, occurrences of anomalies of the semiconductor elements formed of the IGBTs 11 to 16 can be accurately notified to the control portion side, which is an external instrument, as alarm signals PSj with different pulse widths corresponding to the types of the anomalies. Also, anomaly cancellation signals indicating that the respective anomalies are cancelled can be notified to the external instrument as signals of different signal levels which can be distinguished from the alarm signals PSj. Moreover, the anomaly cancellation signals can be output by sharing the output terminal Sn through which to output the alarm signals PSj. Consequently, it is possible to realize the intelligent power module 1a including the drive circuit 3U without making the configuration of the drive circuit 3U complicated and increasing the number of output terminals, thus leading to an immense practical advantage.

The invention is not limited to the heretofore described embodiments. For example, in each embodiment, a description has been given of a case in which the drive device is realized as the intelligent power module 1a, but it is also naturally possible to construct the semiconductor element formed of the IGBT 11 and its drive circuit 3U separately. As opposed to this, in another embodiment of the invention, the plurality of semiconductor elements formed of the IGBTs 11 to 16 and their drive circuits 3U to 3Z may be brought together and constructed as one intelligent power module.

Also, the number of the previously described plurality of protection circuits and the configuration thereof need only be set in accordance with the types of anomaly factors occurring in the IGBT 11. Specifically, a configuration may be such as to detect the anomaly of a direct current drive voltage applied to the IGBT 11. Also, with respect to the previously described pulse widths Tvd, Toc, and Toh of the pulse signals forming the respective alarm signals PSj (PSvd, PSoc, and PSoh) too, it is sufficient that the pulse widths Tvd, Toc, and Toh are set as time widths which can be clearly distinguished from each other.

Furthermore, with respect to each previously described signal too, for example, in other embodiments of the invention, it is also naturally possible to reversely set the logic of each signal, such as by generating the alarm signals PSj (PSvd, PSoc, and PSoh) as the H-level signal trains with the pulse widths Tvd, Toc, and Toh. In this case, it goes without saying that the output circuit, the output control circuit, and the like, only have to be constructed in accordance with the logic of each signal. Apart from that, the invention can be implemented modified in various ways without departing from the scope thereof.

The invention claimed is:

1. A semiconductor element drive device, comprising:
   a drive circuit configured to drive a semiconductor element;
   a plurality of protection circuits configured to detect information related to protecting the semiconductor element, to generate protection signals, and to stop the drive of the semiconductor element by the drive circuit in accordance with the protection signals;
   an alarm generation circuit configured to generate alarm signals with pulse widths corresponding to protection factors in accordance with the protection signals output from the protection circuits;
   an output circuit configured to output the alarm signals at a level;
   a protection cancellation circuit configured to generate a protection cancellation signal over a fixed period when outputs of the plurality of protection signals from the plurality of protection circuits stop and outputs of the alarm signals from the alarm generation circuit stop; and
   an output control circuit configured to change a signal output level of the output circuit in accordance with the protection cancellation signal.

2. The semiconductor element drive device according to claim 1, wherein
   the plurality of protection circuits include a control voltage detection circuit configured to detect a control voltage applied to the drive device, a temperature detection circuit configured to detect a temperature of the semiconductor element, and a current detection circuit configured to detect a current flowing through the semiconductor element, and the plurality of protection circuits being configured to
   generate respective protection signals facilitating low voltage protection, overheating protection, and overcurrent protection.

3. The semiconductor element drive device according to claim 1, wherein
   the protection cancellation circuit includes a one-shot circuit configured to, when the outputs of the plurality of protection signals from the plurality of protection circuits stop and the outputs of the alarm signals from the alarm generation circuit stop, generate the protection cancellation signal over the fixed period.

4. The semiconductor element drive device according to claim 1, wherein
   the output control circuit includes a voltage divider circuit, provided in parallel with an output transistor configuring the output circuit, the voltage divider circuit being configured to divide a control voltage applied to the drive device.

5. The semiconductor element drive device according to claim 1, wherein
the alarm generation circuit is configured to continuously generate an alarm signal with a pulse width preset for a protection circuit, of the plurality of protection circuits, which has first output a protection signal, over a period in which the output of the protection signal is continuing.

6. The semiconductor element drive device according to claim 1, wherein
the alarm generation circuit is configured to, when one of the plurality of protection circuits outputs a protection signal, start to generate the alarm signal, and when the output of the protection signal stops, to stop the generation of the alarm signal at the point at which one pulse's worth of pulse signal in a pulse signal train forming the alarm signal is output.

7. A semiconductor element drive device, comprising:
a drive circuit configured to drive a semiconductor element;

a protection circuit configured to detect information related to protecting the semiconductor element and to output a protection signal configured to stop the drive of the semiconductor element by the drive circuit;

an alarm generation circuit configured to output an alarm signal in accordance with the protection signal output from the protection circuit;

an output circuit configured to output the alarm signal at a first magnitude;

a protection cancellation circuit configured to generate a protection cancellation signal when output of the protection signal and output of the alarm signal stop; and an output control circuit configured to change a signal output level of the output circuit in response to the protection cancellation signal such that the output circuit outputs a signal at a second magnitude different from the first magnitude.

* * * * *